United States Patent
Tsuchiko (12)

(10) Patent No.: US 9,543,292 B2
(45) Date of Patent: Jan. 10, 2017

(54) FIELD EFFECT TRANSISTOR WITH INTEGRATED ZENER DIODE

(71) Applicant: Alpha and Omega Semiconductor Incorporated, Sunnyvale, CA (US)

(72) Inventor: Hideaki Tsuchiko, San Jose, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 14/633,833

(22) Filed: Feb. 27, 2015

(65) Prior Publication Data
US 2016/0254258 A1  Sep. 1, 2016

(51) Int. Cl.
| H01L 27/06 | (2006.01) |
| H01L 21/8232 | (2006.01) |
| H01L 29/06 | (2006.01) |
| H01L 29/08 | (2006.01) |
| H01L 29/808 | (2006.01) |
| H01L 29/866 | (2006.01) |

(52) U.S. Cl.
CPC ....... *H01L 27/0629* (2013.01); *H01L 21/8232* (2013.01); *H01L 29/0619* (2013.01); *H01L 29/808* (2013.01); *H01L 29/866* (2013.01)

(58) Field of Classification Search
None
See application file for complete search history.

(56) References Cited

U.S. PATENT DOCUMENTS

| 5,751,054 | A | * | 5/1998 | Yilmaz | ............... H01L 21/8249 257/355 |
| 7,019,377 | B2 | | 3/2006 | Tsuchiko | |
| 7,759,759 | B2 | | 7/2010 | Tsuchiko | |
| 8,097,905 | B2 | | 1/2012 | Tsuchiko | |
| 8,508,960 | B2 | | 8/2013 | Chen et al. | |
| 8,592,274 | B2 | | 11/2013 | Tsuchiko | |
| 8,722,477 | B2 | | 5/2014 | Tsuchiko | |
| 8,987,821 | B2 | | 3/2015 | Tsuchiko | |
| 9,006,820 | B2 | | 4/2015 | Tsuchiko | |
| 2004/0113204 | A1 | | 6/2004 | Tsuchiko | |
| 2005/0253216 | A1 | | 11/2005 | Tsuchiko | |
| 2005/0258496 | A1 | | 11/2005 | Tsuchiko | |
| 2008/0230812 | A1 | * | 9/2008 | Disney | .................. H01L 29/866 257/272 |
| 2009/0315113 | A1 | * | 12/2009 | Vashchenko | ........ H01L 27/0262 257/355 |
| 2011/0079825 | A1 | | 4/2011 | Tsuchiko | |
| 2013/0069154 | A1 | | 3/2013 | Tsuchiko | |
| 2013/0069157 | A1 | | 3/2013 | Tsuchiko | |
| 2013/0071994 | A1 | | 3/2013 | Tsuchiko | |
| 2013/0072004 | A1 | * | 3/2013 | Tsuchiko | ............ H01L 21/8222 438/492 |
| 2014/0048880 | A1 | | 2/2014 | Tsuchiko | |
| 2014/0167144 | A1 | | 6/2014 | Tsuchiko | |

(Continued)

*Primary Examiner* — Joseph Schoenholtz
(74) *Attorney, Agent, or Firm* — Joshua D. Isenberg; JDI Patent (57) ABSTRACT

One or more Zener diodes and a field effect transistor having a drain connected in series with the one or more Zener diodes are integrally formed by a plurality of doped regions in the same P-type semiconductor substrate and separated by a punch through stop region. An N-type region is formed under the one or more Zener diodes.

31 Claims, 6 Drawing Sheets

(56) References Cited

U.S. PATENT DOCUMENTS

2015/0270255 A1* 9/2015 Ikeda ................. H01L 27/0255
257/77
2015/0325694 A1* 11/2015 Chan .................. H01L 29/7821
327/434

* cited by examiner

FIELD EFFECT TRANSISTOR WITH INTEGRATED ZENER DIODE

FIELD OF THE DISCLOSURE

This present disclosure relates generally to semiconductor devices, and more particularly to semiconductor power devices integrated with Zener diodes and methods of manufacturing such devices.

BACKGROUND

Figure 4:
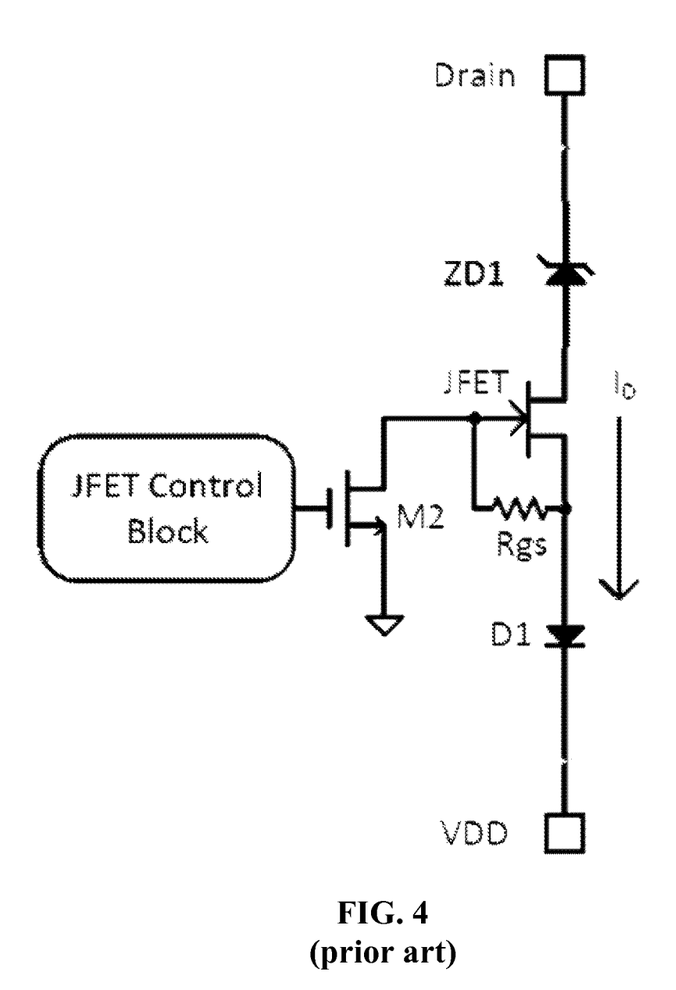
FIG. 4 illustrates a conventional startup circuit.

FIG. 4 depicts a startup circuit used to detect brown in brown out in a rectified AC signal. The circuit includes a normally on transistor (e.g., a JFET) connected in series to a Zener diode ZD1. A Zener diode allows current to flow in the forward direction in the same manner as a conventional diode, but also permits it to flow in the reverse direction when the voltage is above a certain value, the so-called Zener voltage.

The startup circuit depicted in FIG. 4 is used to detect an input voltage at a drain to thereby generate a detection signal. In this voltage detector, a Zener diode ZD1 has a cathode connected to a terminal that receives the input voltage, a junction field effect transistor (JFET) has a drain acting as an input terminal connected to an anode of the Zener diode ZD1, a source acting as an output terminal and a gate acting as a control terminal, a resistor Rgs is connected between the source and the gate of the JFET, and a switch M2 is connected between the gate of the JFET and ground, and is controlled by a control signal from a JFET control block. When the switch M2 is off, the voltage detector does not detect the input voltage at the input terminal. When the switch M2 is on, if the input voltage at the detect terminal is higher than the breakdown voltage of the Zener diode ZD1, the JFET operates and thereby produces a current $I_D$ flowing through the JFET from drain to source. Since the switch is on, the gate of the JFET is grounded, and the current $I_D$ will flow through the resistor Rgs to increase the source-gate voltage of the JFET, i.e., the gate-source voltage of the JFET decreases. The gate-source voltage $V_{GS}$ of the JFET will become equal to a pinch-off voltage of the JFET, and thus the voltage drop across the resistor Rgs will be equal to the pinch off voltage.

When the switch M2 is on, if the input voltage is lower than the breakdown voltage of the Zener diode, there will be no current $I_D$ flowing through the JFET, and since the gate of the JFET is grounded, the JFET has its source and gate at the same potential, i.e., the voltage drop across the resistor Rgs is zero. Because the leakage current of the JFET is almost zero, the voltage detector has nearly no power loss when detecting the input voltage Vin.

As discussed above, according to the voltage drop across the resistor Rgs, the voltage detector can determine whether the input voltage Vin is higher or lower than the breakdown voltage of the zener diode ZD1, so that a detection signal can be derived from the voltage drop across the resistor Rgs. If the JFET is grounded by the switch M2, the source voltage of the JFET can be directly taken as the detection signal. In this voltage detector, the breakdown voltage of the Zener diode ZD1 is taken as a reference voltage for detection, which may be altered by selecting or adjusting the breakdown voltage of the zener diode ZD1 or by adding more zener diodes connected in series.

It is within this context that embodiments of the present invention arise.

BRIEF DESCRIPTION OF THE DRAWINGS

Aspects of the present disclosure will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Introduction

In recent years, combination of multiple functions on a single chip smart power technologies have gained more importance. It enables miniature system design and includes diagnostic and protection functions to the power transistors, which increase the robustness and reliability of power driver for various applications.

Aspects of the present disclosure are directed to devices having a depletion-transistor integrated with one or more Zener diodes in one single chip, e.g., for a startup circuit.

Device Construction

The drawings are not to scale unless it is stated otherwise. Conventional startup circuits of the type depicted in FIG. 4 use multiple components. According to aspects of the present disclosure, a Zener diode and depletion MOS FET or JFET may be integrated into one chip.

Figure 1A:
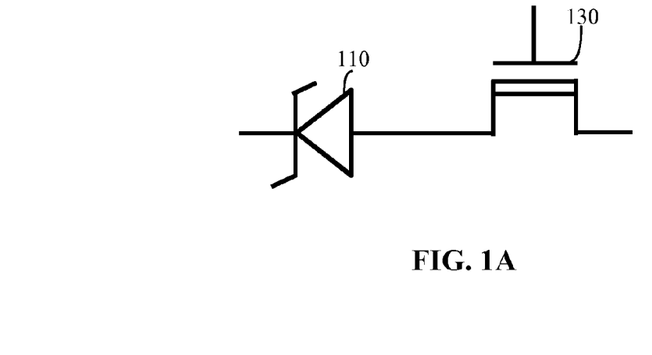
FIG. 1A is a schematic diagram illustrating a device including a Zener diode with a depletion mode metal oxide field effect transistor (MOSFET) according to one embodiment of the present disclosure.
Figures 2A, 2B:
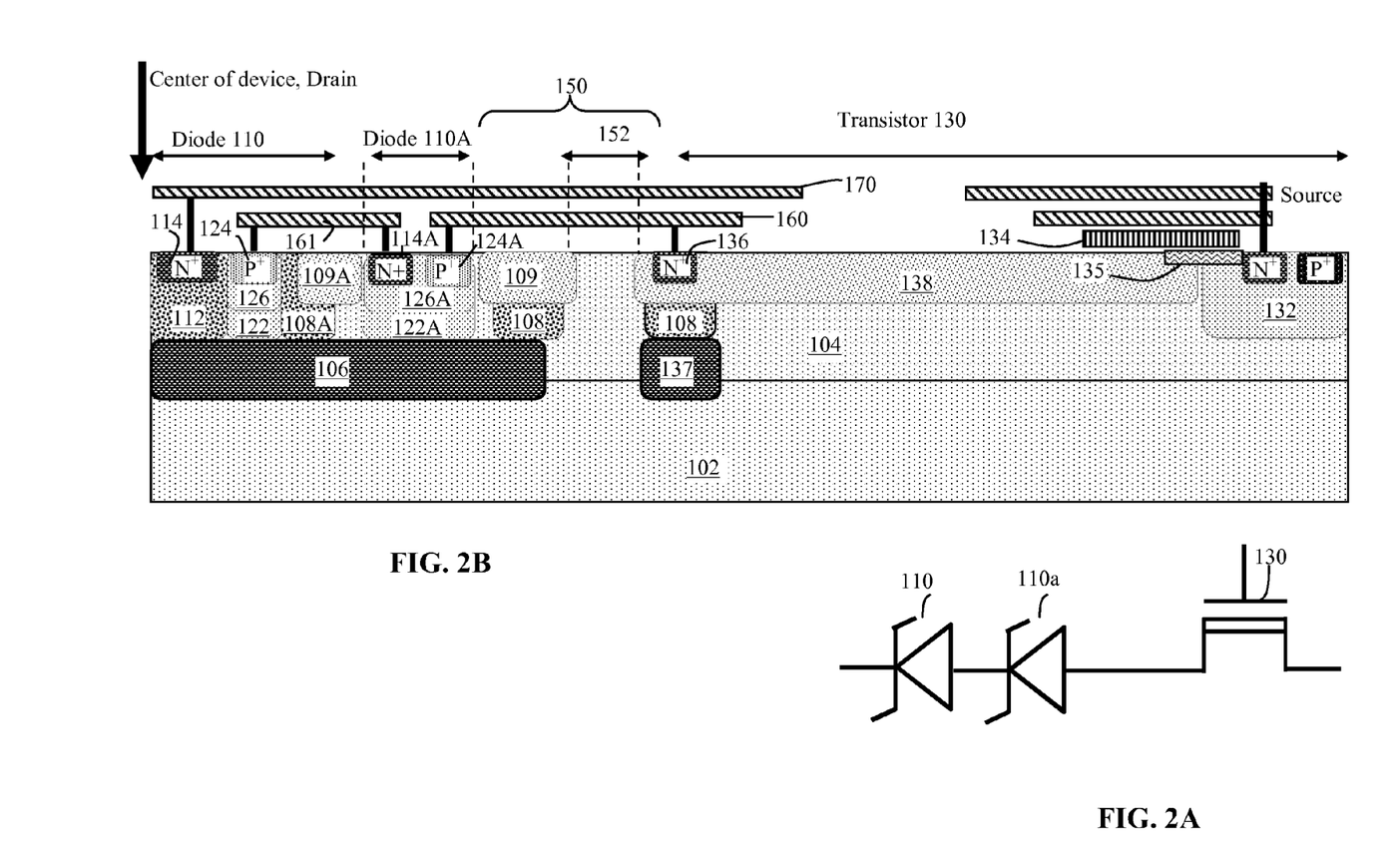
FIG. 2A is a schematic diagram illustrating a device including Zener diodes with a transistor according to an aspect of the present disclosure.
FIG. 2B is a cross-sectional view illustrating portions of a device integrating Zener diodes with a transistor according to an aspect of the present disclosure.

FIG. 1A is a schematic diagram illustrating a device including a Zener diode with a transistor according to an aspect of the present disclosure. The device 100 includes a Zener diode 110 and a "normally on" field effect transistor 130 that provides a constant current with respect to an input voltage, such as a drain voltage. As shown in FIG. 1A, the anode of the Zener diode 110 is connected to the drain of the transistor 130. The transistor 130 may be a depletion-mode transistor, which is a normally ON device and can increase or reduce its drain current by the gate potential. It shuts off the drain current by either or both gate and source potential. By way of example and not by way of limitation, the transistor 130 may alternatively be a junction gate field-effect transistor (JFET). The Zener voltage of the Zener diode 110 is used to control the voltage input to the transistor 130. When the input voltage is lower than the breakdown voltage of the Zener diode 110, the transistor 130 is disabled and there no current flows through it. When the input voltage is higher than the breakdown voltage, the transistor 130 conducts current. While FIG. 1A shows only one Zener diode 110 is connected to a transistor 130, it is noted that two or more Zener diodes can be connected in series as shown in FIG. 2A to add up the Zener voltages as the detection voltage or start-up voltage for turning on the connected transistor 130.

Figure 1B:
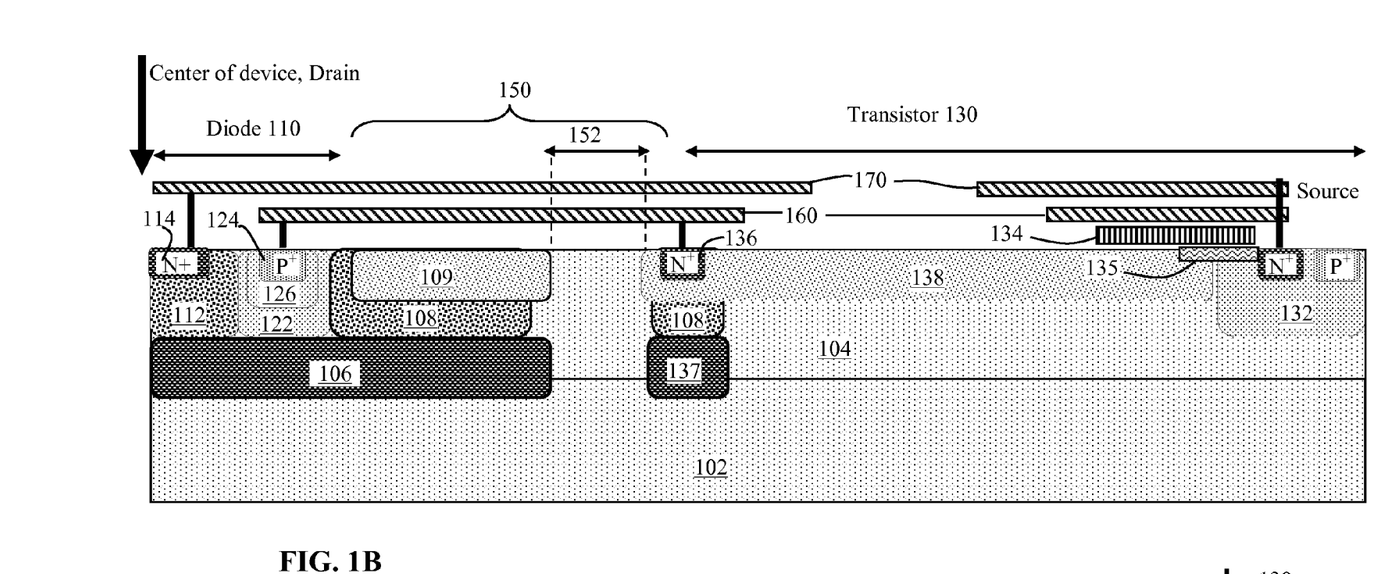
FIG. 1B is a cross-sectional view illustrating portions of a device integrating a Zener diode with a depletion mode metal oxide field effect transistor (MOSFET) according to an aspect of the present disclosure.

FIG. 1B is a cross-sectional view illustrating portions of a device integrating a Zener diode with a transistor in a single chip according to one embodiment of the present disclosure. The device 100 includes a substrate 102 of a first conductivity type semiconductor (e.g., P substrate). The substrate 102 may be doped with a P-type dopant such as boron. An (optional) epitaxial layer 104 of the first conductivity type (e.g., P type epitaxial layer) is formed over the P-type substrate 102. In one example, the epitaxial layer 104 may be formed by an epitaxial growth process as known in the art. The substrate 102 and the epitaxial layer 104 is lightly doped. In some implementation, they may have a doping concentration that is in a range from about $10^{14}$/centimeter$^3$ to about $10^{16}$/centimeter$^3$. The thickness of the epitaxial layer 104 may be in a range from about 2 microns to about 10 microns.

The Zener diode 110 and the depletion-mode transistor 130 are formed in the P-type epitaxial layer 104 over the P-type substrate 102. With respect to the Zener diode 110, an N-type well 112 and a P-type well 122 may be provided in the P-type epitaxial layer 104. An N+ region 114 serves as the cathode of the diode is encompassed in the N-type well 112. A P+ region 124 serves as the anode of the diode is encompassed in a P-type body region 126 in the P-type well 122. These regions may be formed by ion implantation process known in the art. The doping concentrations of the N-type well 112 and the P-type well 122 determine the turn on voltage for the Zener diode 110. The N+ region 114 is more heavily doped than the N-type well 112. A slight gap of, e.g., a few $\frac{1}{10}^{ths}$ of a micron to a few microns between the N-type well 112 and P-type well 122 can increase the breakdown voltage. In some implementation, the N+ region 114 has a doping concentration that is in a range from about $10^{19}$/cm$^3$ to about $10^{21}$/cm$^3$ and the N-type well 112 has a doping concentration of about $10^{16}$/cm$^3$ to about $10^{18}$/cm$^3$. In addition, the P+ region 124 is doped heavier than the P-type body region 126 and the P-type well 122. The P+ region is almost saturated. In some implementations, the P+ region 124 may have a doping concentration that is in a range from about $10^{19}$/cm$^3$ to about $10^{20}$/cm$^3$. The doping concentration of the P-type body region 126 and the P-type well 122 is about $10^{16}$/cm$^3$ to about $10^{18}$/cm$^3$.

With respect to the transistor 130, a P-type well 132 as the body of the transistor 130 is provided in the P-type epitaxial layer 104. P+ body pickup and N+ source regions are formed in the body 132. The P+ body pickup may have a doping concentration that is in a range from about $10^{19}$/cm$^3$ to about $10^{20}$/cm$^3$ and the N+ source may have a doping concentration of about $10^{19}$/cm$^3$ to about $10^{21}$/cm$^3$. In addition. The P-type well 132 is doped heavier than the P-type substrate 102. A layer of polysilicon 134 serving as the gate of the transistor 130 is provided over the top surface of the P-type epitaxial layer 104. The gate 134 is electrically isolated from the epitaxial layer 104 with a gate insulator layer, e.g., an oxide. In addition, the device may include field oxide (not shown), e.g., over active areas for the gate and N+/P+ implant regions, as is conventionally done. For the sake of clarity and simplicity, regions of field oxide have been omitted. However, devices that include field oxide are within the scope of the present disclosure.

A high voltage N-type well (HVNW) 138 is provided in the P-type epitaxial layer 104 to provide drain extension area. The lightly doped HVNW 138 has a doping concentration that is in a range from about $10^{15}$/cm$^3$ to about $10^{17}$/cm$^3$. A depletion implant layer 135 is located under the gate and over portions of the P-well 132 and the HVNW 138. The depletion layer, 135, makes the MOS FET 130 a normally on device. The on state can be turned off by controlling either gate or source potential with respect to the body potential. A heavily doped N+ region 136 encompassed in the HVNW 138 serves as the drain of the transistor 130.

In addition, a junction area 150 including a punch through stop 152 is disposed between the diode 110 and the transistor 130. The punch through stop is basically a region of the substrate 102 and epitaxial layer 104 that is less heavily P-type doped than, e.g., the P-well 122 and P+ regions 124, 126. At the edges of the junction area 150, isolation structures are provided. The punch through voltage of the device can be adjusted by adjusting the width of the punch through stop 152. Preferably the punch though voltage is greater than the turn on voltage of the Zener diode 110. If the punch through voltage is "lower" than Zener breakdown voltage, the Zener diode 110 would conduct current to the transistor 130 before the breakdown. This would render the Zener non-functional In order to integrate the Zener diode 110 and transistor 130 into the same substrate devices according to aspects of the present disclosure include an isolation structure configured to act as a punch through stopper between anode of Zener diode and the substrate 102. An isolation structure may include an N-type buried layer (NBL) 106, an N-type well 108 on top of the NBL 106, and a high voltage N-well (HVNW) 109 over the N-type well 108. The doping concentration for the HVNW 109 may be in a range from about $10^{15}$/cm$^3$ to about $10^{17}$/cm$^3$. The NBL 106 is formed between the P-type substrate 102 and the P-type epitaxial layer 104. The NBL 106 stops punch through from the P-well 122 or P-body region 126 to the P-type substrate 102. As shown in FIG. 1B, the NBL 106 is formed in the diode region and the edge of the junction area 150 to relax electrical field. A similar N-well 108 and an (optional) NBL 137 may be formed under the doped region 136 that acts as the drain of the transistor 130. The NBL 137 may be omitted, if the electric field at the edge of the transistor 130 does not have to be relaxed.

For a very high voltage device, (e.g., >500V) the NBL 137 helps relax the field, but lower voltage device may not need it.

Furthermore, the device 100 includes first and second metal field plates 160 and 170 for electrical connection and shielding. The field plates 160, 170 may be electrically isolated from undesired electrical contact with each other and with the rest of the device by one or more insulating layers, e.g., oxide layers, as is commonly done.

Figure 1C:
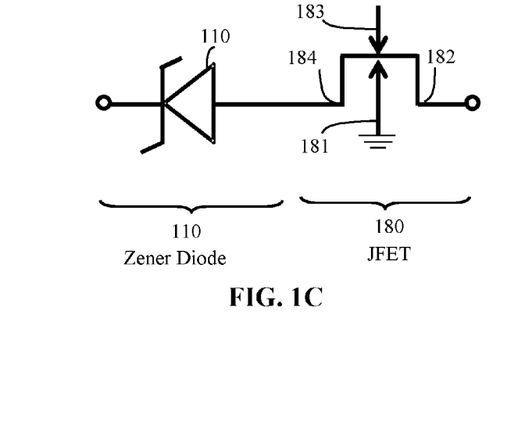
FIG. 1C is a schematic diagram illustrating a device including a Zener diode with a junction field effect transistor (JFET) according to an aspect of the present disclosure.
Figure 1D:
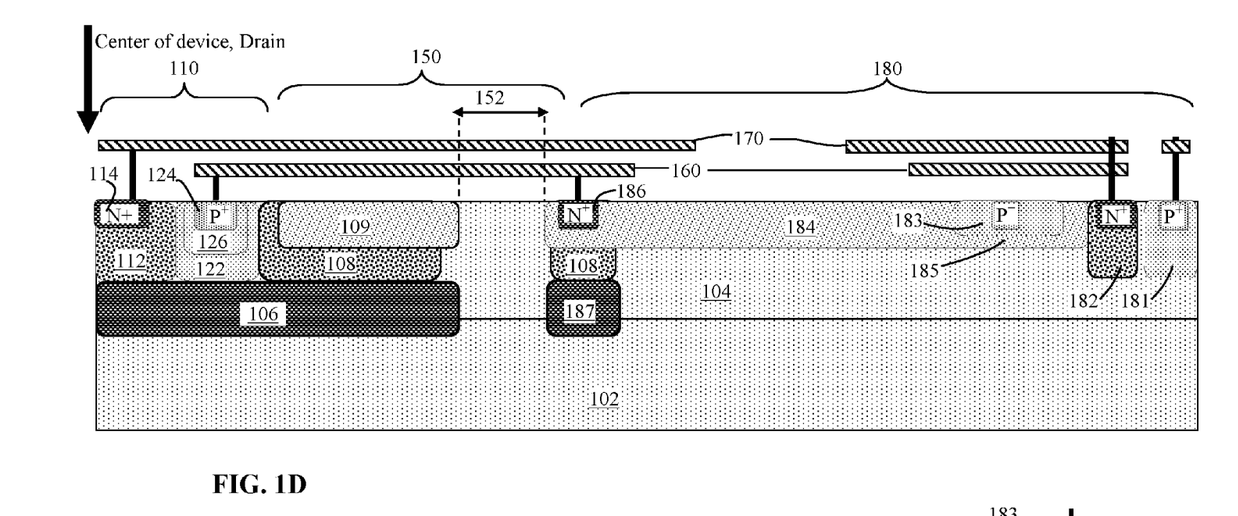
FIG. 1D is a cross-sectional view illustrating portions of a device integrating a Zener diode with a transistor according to an aspect of the present disclosure.

FIG. 1C and FIG. 1D illustrate an example in which a Zener diode 110 is integrated onto the same substrate as a JFET 180. In example shown in FIG. 1D, the JFET 180 is an N-channel JFET. However, aspects of the present disclosure are not limited to such implementations. The Zener diode 110 in FIG. 1D has the same structure as the Zener diode 110 of FIG. 1B. The JFET 180 includes a bottom gate 181, a source 182, a floating top gate 183, and a high voltage N-well (HVNW) that acts as an extended drain 184. The bottom gate 181 includes a P+ region inside a P-well at an outer edge of the device. The bottom gate 181 is electrically connected to ground potential, as shown in FIG. 1C. The source 182 is formed in the epitaxial layer 104 from an N+ region inside an N-well between the bottom gate 181 and the top gate 183. The source 182 is electrically connected to a portion of the upper metal layer 170 that acts as a source electrode and field plate. The top gate 183 includes a P+ region inside a less heavily doped P-well formed in the HVNW 184 under a portion of the metal layer 160 that acts as a top gate electrode. A gate voltage may be applied to the top gate 183 through an electrical connection (not shown). An N-channel 185 is formed in the HVNW 184 under the top gate 183 when the gate voltage is applied to the top gate. The JFET 180 is isolated from the Zener diode by a structure similar to that shown in FIG. 1B.

A similar N-well 108 and an (optional) NBL 187 may be formed under a doped region 186 that acts as the drain contact for the JFET 180. The NBL 187 may be omitted, if the electric field at the edge of the transistor 180 does not have to be relaxed. The drain contact 186 may be connected to the anode 124 of the Zener diode 110 through a portion of the lower metal layer 160.

As discussed above, FIG. 2B illustrates portions of a device integrating two Zener diodes 110, 110A with a transistor according to one embodiment of the present disclosure.

Similar to FIG. 1B. Elements common to FIG. 1B and FIG. 2B are indicated by the same or similar reference numerals. In addition to a Zener diode 110 the device depicted in FIG. 2B includes a second diode 110A along with the depletion-mode transistor 130. As with the device of FIG. 1B, the Zener diodes 110, 110A and transistor 130 are formed in a P-type epitaxial layer 104 over a P-type substrate 102. Zener diode 110 may be configured as discussed above with respect to FIG. 1A. Likewise the second Zener diode 110A may include an N-type well 112A and a P-type well 122A formed in the P-type epitaxial layer 104. An N+ region 114A that serves as the cathode of the diode 110A and a P+ region 124A that serves as the anode of the diode 110A are encompassed in a P-type well region 126A in the P-type well 122A. These regions may be formed by ion implantation process known in the art to dopant concentrations within the ranges described above with respect to corresponding regions in FIG. 1A. The anode 124 of the Zener diode 110 may be connected to the cathode 114A of the second Zener diode 110, e.g., by a metal structure 161, which can be part of the same metal layer as the field plate 160. The diodes 110, 110A may be isolated by an isolation structure having an N-type buried layer (NBL) 106 underneath both diodes and individual isolation structures including N-type wells 108, 108A on top of the NBL 106, and HVNW 109,109A over the N-type wells. As with the device of FIG. 1B, the NBL 106 is formed between the P-type substrate 102 and the P-type epitaxial layer 104. One N-type well 108A and HVNW 109A are formed between the two diodes 110, 110A and another N-type well 108 and HVNW 109 are formed between the second diode 110A and the transistor 130.

It is noted that the device of FIG. 1D may be similarly modified to incorporate two Zener diodes in the manner shown in FIG. 2B.

Figure 3A:
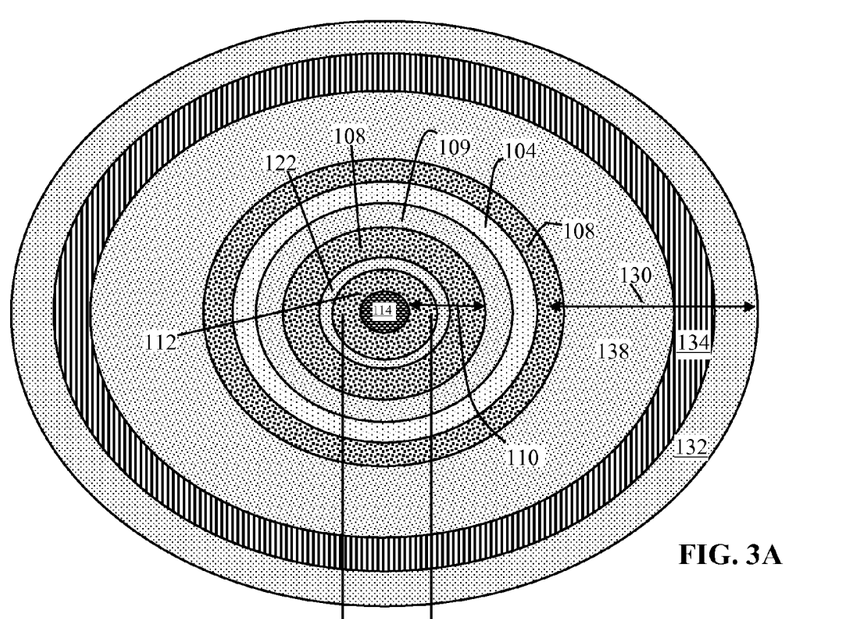
FIG. 3A-3C are top views of a device of FIG. 1 according to an aspect of the present disclosure.
Figure 3B:
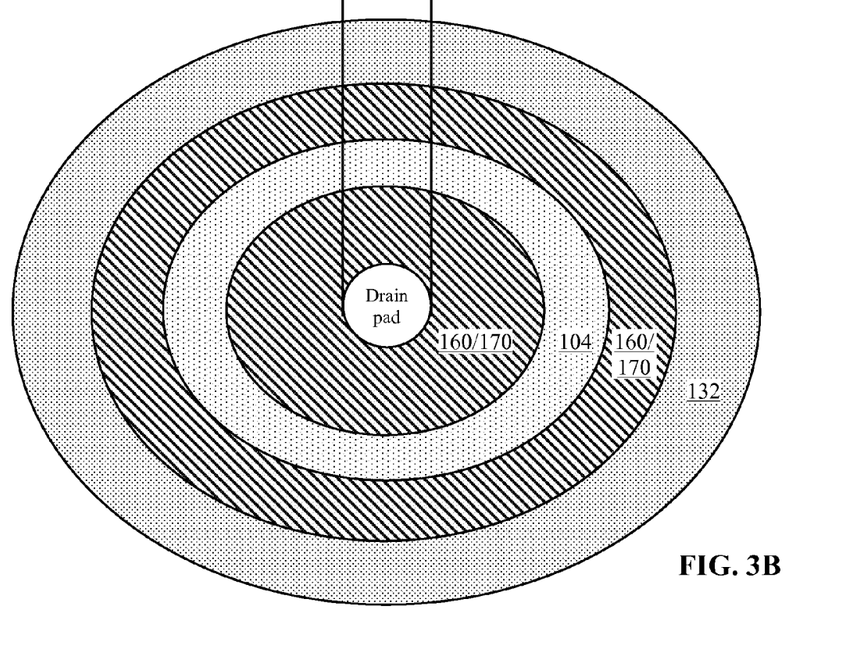
Figure 3C:
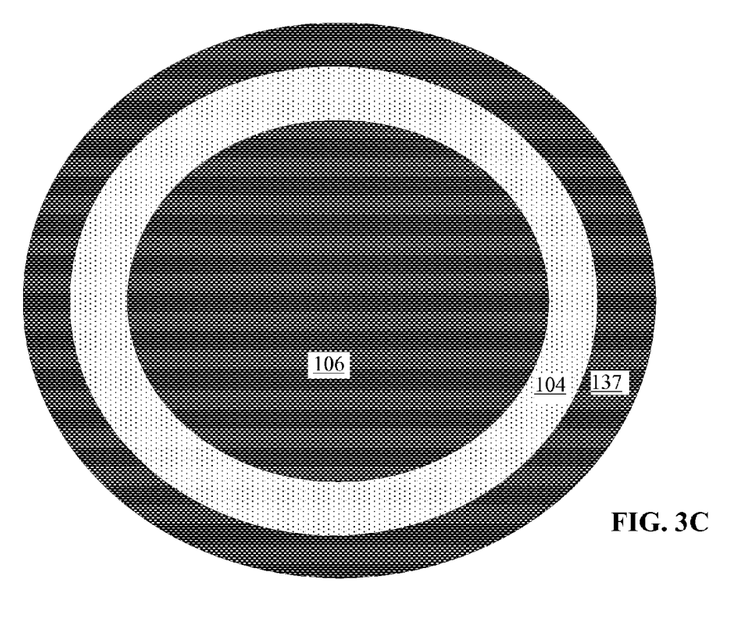

FIG. 3A-3C are top views of a device of FIG. 1B according to an aspect of the present disclosure. FIG. 3A is a top view of a device of FIG. 1B showing the structure in the P-type epitaxial layer 104 and the gate 134. FIG. 3B is a top view of a device of FIG. 1B showing the metal field plates 160 and 170. FIG. 3C is a top view of a device of FIG. 1B showing NBL 106 and P-Epi 104. As can be seen from these drawings, the device in FIG. 1B is circularly symmetric about the cathode 114 of the Zener diode 110, which is connected to drain potential. The other regions of the device are formed in concentric rings with the cathode 114 at the center. The devices shown in FIG. 1C and FIG. 2B may be similarly circularly symmetric. Although circularly symmetric devices are described herein, those skilled in the art will appreciate that other types of symmetry may be used.

Devices of the type described herein may be fabricated by forming depletion device or junction field effect transistor (JFET) having a drain connected in series with the one or more Zener diodes by forming a plurality of doped regions of the type described herein in the same P-type semiconductor substrate and separated by a punch through stop region. The key step is forming a first N-type region 106 in the substrate under the one or more Zener diodes and (optionally) a second N-type region 137 in the substrate under the depletion device or JFET 130 with the first and second N-type regions are separated by the punch through stop 152. The various doped regions may be formed in any suitable order depending on the doping techniques used. For example, a high energy implant may be used to form the buried N-type regions 106, 137 under the one or more Zener diodes 110, 110A. Alternatively, N-type regions 106, 137 may be formed before forming the doped regions located above them. In such a case, the buried N-type regions may be formed directly into the P-type substrate 102 and the epitaxial layer 104 may be omitted.

In such implementations, doped regions that are described as being formed in the epitaxial layer 104 may be formed directly into the substrate 102. Alternatively, the N-type regions may be formed by more conventional implant into the substrate 102 before forming the epitaxial layer 104. This may be followed by a heating step to diffuse the dopants vertically into the epitaxial layer.

Although the above examples are described for a device formed on a P-type substrate, aspects of the present disclosure include implementations in which P-type and N-type are switched.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6. Although certain process steps may appear in a certain order in the claims, the steps are not required to be carried out in any particular order unless a particular order is otherwise specified by the claim language.

What is claimed is:

1. A device, comprising:
one or more Zener diodes; and
a field effect transistor having a drain connected in series with the one or more Zener diodes;
wherein the one or more Zener diodes and field effect transistor are formed by a plurality of doped regions on a common P-type semiconductor substrate and separated by a punch through stop region; and
an N-type region formed under the one or more Zener diodes configured to stop punch through from a P-well or P-body region of the Zener diode to the common P-type semiconductor substrate, wherein the one or more Zener diodes include an N-type region formed in the common P-type substrate and a P-type region formed in a layer of the P-type substrate adjacent the N-type region.

2. A device, comprising:
one or more Zener diodes; and
a field effect transistor having a drain connected in series with the one or more Zener diodes;
wherein the one or more Zener diodes and field effect transistor are formed by a plurality of doped regions on a common P-type semiconductor substrate and separated by a punch through stop region; and
an N-type region formed under the one or more Zener diodes configured to stop punch through from a P-well or P-body region of the Zener diode to the common P-type semiconductor substrate; and
an isolation structure formed in the common P-type semiconductor substrate over the N-type region between the one or more Zener diodes and the field effect transistor, wherein the isolation structure includes an N-type well and a high voltage N-well that is formed over the N-type well, wherein the high voltage N-well is more heavily N-type doped than the N-type well.

3. A device, comprising:
one or more Zener diodes; and
a field effect transistor having a drain connected in series with the one or more Zener diodes;
wherein the one or more Zener diodes and field effect transistor are formed by a plurality of doped regions on a common P-type semiconductor substrate and separated by a punch through stop region; and
an N-type region formed under the one or more Zener diodes configured to stop punch through from a P-well or P-body region of the Zener diode to the common P-type semiconductor substrate, wherein the one or more Zener diodes include first and second Zener diodes connected to each other in series.

4. The device of claim 3, wherein each of the first and second Zener diodes includes an N-type region formed in the epitaxial layer and a P-type region formed in the epitaxial layer adjacent the N-type region.

5. The device of claim 3, further comprising a first isolation structure formed in the common P-type semiconductor substrate over the first N-type region between the first and second Zener diodes and the field effect transistor and a second isolation structure formed in the semiconductor substrate over the first N-type region between the first Zener diode and the second Zener diode.

6. A device, comprising:
one or more Zener diodes; and
a field effect transistor having a drain connected in series with the one or more Zener diodes;
wherein the one or more Zener diodes and field effect transistor are formed by a plurality of doped regions on a common P-type semiconductor substrate and separated by a punch through stop region; and
an N-type region formed under the one or more Zener diodes configured to stop punch through from a P-well or P-body region of the Zener diode to the common P-type semiconductor substrate, wherein the plurality of doped regions include a plurality of concentric regions with a cathode of one of the one or more Zener diodes located at a center of the plurality of concentric regions.

7. The device of claim 6, wherein the plurality of doped regions include an outermost region, wherein the outermost region is a source of the field effect transistor.

8. The device of claim 6, wherein the field effect transistor is a depletion mode transistor.

9. The device of claim 6, wherein the field effect transistor is a junction field effect transistor (JFET).

10. The device of claim 6, further comprising a second N-type region formed in the common P-type substrate under the field effect transistor, wherein the first and second N-type regions are separated by the punch through stop region.

11. The device of claim 6, wherein the common P-type semiconductor substrate includes a P-type epitaxial layer formed on a P-type substrate.

12. The device of claim 11, wherein the one or more Zener diodes include an N-type region formed in the epitaxial layer and a P-type region formed in the epitaxial layer adjacent the N-type region.

13. The device of claim 11, wherein the N-type region formed under the one or more Zener diodes is an N-type buried layer formed between the P-type substrate and the P-type epitaxial layer.

14. The device of claim 1, wherein the common P-type semiconductor substrate includes a P-type epitaxial layer formed on a P-type substrate.

15. The device of claim 14, wherein the one or more Zener diodes include an N-type region formed in the epitaxial layer and a P-type region formed in the epitaxial layer adjacent the N-type region.

16. The device of claim 14, wherein the N-type region formed under the one or more Zener diodes is an N-type buried layer formed between the P-type substrate and the P-type epitaxial layer.

17. The device of claim 1, wherein the field effect transistor is a depletion mode transistor.

18. The device of claim 1, wherein the field effect transistor is a junction field effect transistor (JFET).

19. The device of claim 1, further comprising a second N-type region formed in the common P-type substrate under the field effect transistor, wherein the first and second N-type regions are separated by the punch through stop region.

20. The device of claim 2, wherein the common P-type semiconductor substrate includes a P-type epitaxial layer formed on a P-type substrate.

21. The device of claim 20, wherein the one or more Zener diodes include an N-type region formed in the epitaxial layer and a P-type region formed in the epitaxial layer adjacent the N-type region.

22. The device of claim 20, wherein the N-type region formed under the one or more Zener diodes is an N-type buried layer formed between the P-type substrate and the P-type epitaxial layer.

23. The device of claim 2, wherein the field effect transistor is a depletion mode transistor.

24. The device of claim 2, wherein the field effect transistor is a junction field effect transistor (JFET).

25. The device of claim 2, further comprising a second N-type region formed in the common P-type substrate under the field effect transistor, wherein the first and second N-type regions are separated by the punch through stop region.

26. The device of claim 2, wherein the common P-type semiconductor substrate includes a P-type epitaxial layer formed on a P-type substrate.

27. The device of claim 25, wherein the one or more Zener diodes include an N-type region formed in the epitaxial layer and a P-type region formed in the epitaxial layer adjacent the N-type region.

28. The device of claim 25, wherein the N-type region formed under the one or more Zener diodes is an N-type buried layer formed between the P-type substrate and the P-type epitaxial layer.

29. The device of claim 3, wherein the field effect transistor is a depletion mode transistor.

30. The device of claim 3, wherein the field effect transistor is a junction field effect transistor (JFET).

31. The device of claim 3, further comprising a second N-type region formed in the common P-type substrate under the field effect transistor, wherein the first and second N-type regions are separated by the punch through stop region.

* * * * *